United States Patent
Kim et al.

(10) Patent No.: US 8,213,230 B2
(45) Date of Patent: Jul. 3, 2012

(54) NONVOLATILE MEMORY DEVICE AND METHOD FOR OPERATING THE SAME

(75) Inventors: Nam-Kyeong Kim, Gyeonggi-do (KR); Jung-Min Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 10 days.

(21) Appl. No.: 12/878,438

(22) Filed: Sep. 9, 2010

(65) Prior Publication Data

US 2012/0008392 A1  Jan. 12, 2012

(30) Foreign Application Priority Data

Jul. 7, 2010 (KR) .................. 10-2010-0065302

(51) Int. Cl.
*G11C 16/06* (2006.01)
(52) U.S. Cl. ......... 365/185.11; 365/185.29; 365/185.13; 365/241; 365/230.01
(58) Field of Classification Search ............. 365/185.11, 365/185.29, 185.13, 241, 230.01
See application file for complete search history.

(56) References Cited

U.S. PATENT DOCUMENTS

2009/0279365 A1* 11/2009 Tanaka ................ 365/185.33

FOREIGN PATENT DOCUMENTS

KR  1020100028782  3/2010

OTHER PUBLICATIONS

Notice of Preliminary Rejection issued from Korean Intellectual Property Office on Jul. 29, 2011.

* cited by examiner

*Primary Examiner* — Thong Q Le
(74) *Attorney, Agent, or Firm* — IP & T Group LLP

(57) ABSTRACT

A nonvolatile memory device includes a plurality of memory blocks, a plurality of erasure detection units provided at the plurality of memory blocks, respectively, and configured to each detect erasure of the respective memory blocks, and a control unit configured to determine that a memory block is a bad memory block when a number of erasure operations performed on the memory block as detected by the respective erasure detection unit is greater than a reference value.

14 Claims, 2 Drawing Sheets

NONVOLATILE MEMORY DEVICE AND METHOD FOR OPERATING THE SAME

CROSS-REFERENCE TO RELATED APPLICATIONS

The present application claims priority of Korean Patent Application No. 10-2010-0065302, filed on Jul. 7, 2010, which is incorporated herein by reference in its entirety.

BACKGROUND OF THE INVENTION

Exemplary embodiments of the present invention relate to a technology for improving the reliability of a nonvolatile memory device.

A memory device is categorized into a volatile memory device and a nonvolatile memory device, depending on whether data is retained when power is interrupted. The volatile memory device is a memory device which loses data when power is interrupted. Examples of the volatile memory device include DRAMs and SRAMs. The nonvolatile memory device is a memory device which retains stored data even though power is interrupted. Examples of the nonvolatile memory device include a flash memory device.

The main operations of the nonvolatile memory device are an erasure operation, a read operation, and a program operation. When the erasure operation and the program operation are repetitively performed on the nonvolatile memory device, the physical characteristics of the nonvolatile memory device are degraded and the reliability of the memory cells decreases.

Therefore, a technology which selects a memory cell on which an erasure operation and a program operation are repeated among memory cells of the nonvolatile memory device, and manages the degraded memory cell not to be used is useful.

SUMMARY OF THE INVENTION

An embodiment of the present invention is directed to a nonvolatile memory device which detects a number of erasure operations in each memory block, which is the unit of the erasure operation, treats a memory block as a bad memory block when the number of the erasure operations of the block exceeds a reference value, thereby improving the reliability of the nonvolatile memory device.

In accordance with an embodiment of the present invention, a nonvolatile memory device includes: a plurality of memory blocks; a plurality of erasure detection units provided at the plurality of memory blocks, respectively, and configured to each detect erasure of the respective memory block; and a control unit configured to determine that a memory block of the plurality of memory blocks is a bad memory block when a number of erasure operations performed on the memory block as detected by the respective erasure detection unit is greater than a reference value.

The erasure detection unit may each detect the application of an erasure voltage to a word line for the respective memory block.

In accordance with another embodiment of the present invention, a method for operating a nonvolatile memory device includes: performing an erasure operation on a memory block selected among a plurality of memory block; determining a number of erasure operations performed the memory block; and determining that the memory block is a bad memory block when a number of erasure operations performed on the memory block is greater than a reference value.

The determining a number of erasure operations includes: activating a detection signal when an erasure voltage is applied to a word line of the memory block and an erasure bias is applied to a well region of the memory block; storing the detection signal; and counting number of change in a logic value of the stored detection signal.

DESCRIPTION OF SPECIFIC EMBODIMENTS

Figure 1:
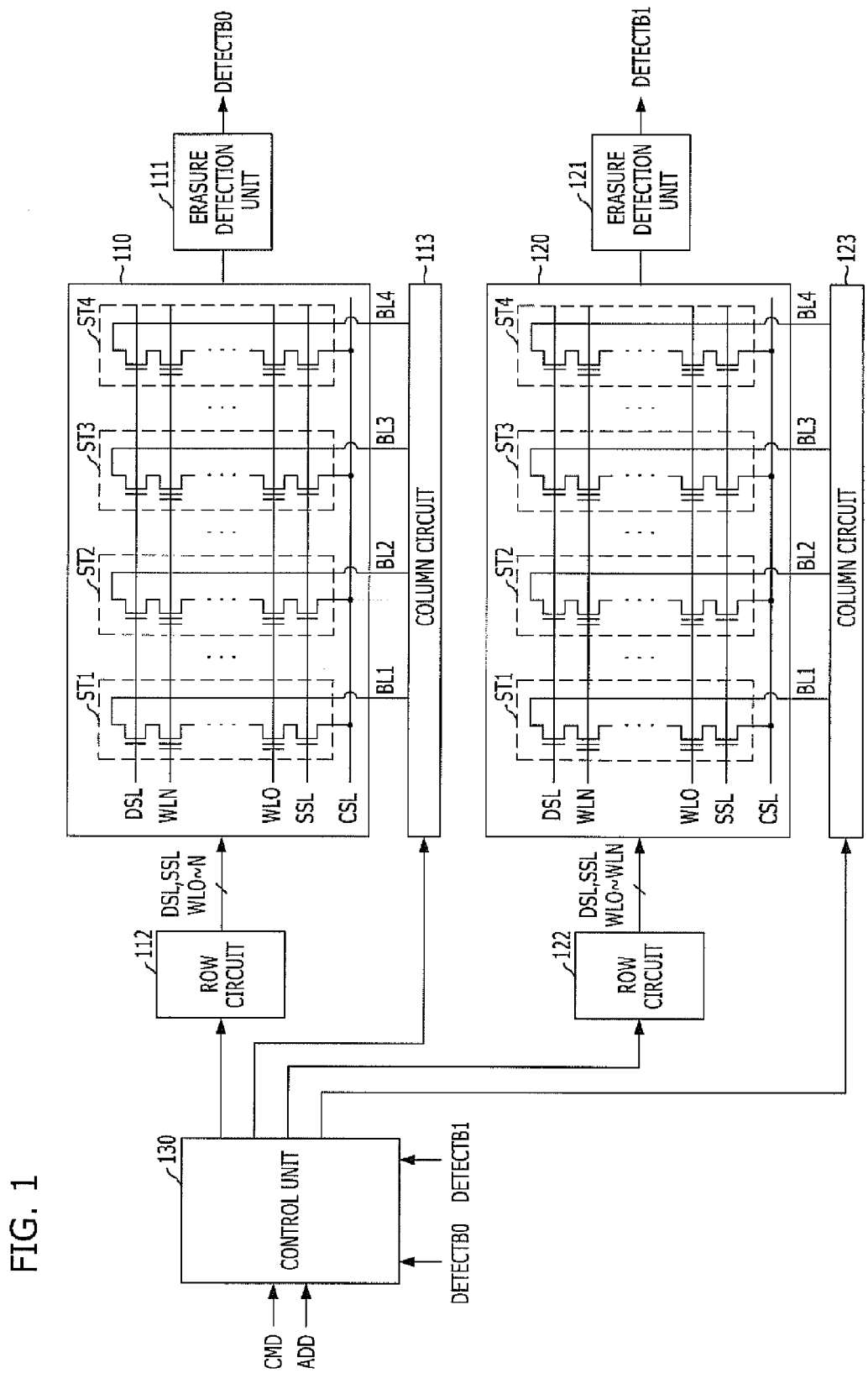
FIG. 1 is a configuration diagram of a nonvolatile memory device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a configuration diagram of a nonvolatile memory device in accordance with an embodiment of the present invention.

Referring to FIG. 1, the nonvolatile memory device includes memory blocks 110 and 120, erasure detection units 111 and 121, a control unit 130, row circuits 112 and 122, and column circuits 113 and 123.

The plurality of memory blocks 110 and 120 (only two blocks are exemplarily illustrated in FIG. 1) are provided in the nonvolatile memory device. Each of the memory blocks 110 and 120 includes a plurality of pages, each of which has a plurality of memory cells. In a NAND flash memory, the memory block is the unit of the erasure operation, and the page is the unit of the read or program operation.

Meanwhile, each of the memory blocks 110 and 120 includes a plurality of memory strings ST1 to ST4. Four strings for each memory block are exemplarily illustrated in FIG. 1. The memory strings ST1 to ST4 include source select transistors having sources coupled to a common source line CSL, a plurality of memory cells, and drain select transistors having drains coupled to bit lines BL1 to BL4, respectively. Gates of the source select transistors are coupled to a source select line SSL. Gates of the memory cells are coupled to word lines WL0 to WLN, respectively. Gates of the drain select transistors are coupled to a drain select line DSL. The memory strings ST1 to ST4 are coupled between the corresponding bit lines BL1 to BL4 and the common source line CSL.

The row circuits 112 and 122 are provided at the memory blocks 110 and 120, respectively, and apply voltages suitable for the erasure/read/program operations to the word lines WL0 to WLN, the drain select line DSL, and the source select line SSL under the control of the control unit 130.

The column circuits 113 and 123 are provided at the memory blocks 110 and 120, respectively, and control the bit lines BL1 to BL4 according to the erasure/read/program operations under the control of the control unit 130. A plurality of page buffers are provided within the column circuits 113 and 123.

The control unit 130 receives a command CMD and an address ADD inputted from the outside of the memory device, and controls the row circuits 112 and 122 and the column circuits 113 and 123 so that the memory blocks 110 and 120 may be erasured/read/programmed.

The erasure detection units 111 and 121 are provided at the memory blocks 110 and 120 and detect the erasure operation performed on the memory blocks 110 and 120, respectively. When the erasure operation is performed on the memory block 110, the erasure detection unit 111 informs the control unit 130 of the erasure operation. When the erasure operation is performed on the memory block 120, the erasure detection unit 121 informs the control unit 130 of the erasure operation. The control unit 130 stores the number of the erasure operations of the memory blocks 110 and 120. When the number of the erasure operations of the memory blocks 110 and 120 exceeds a reference value (for example, a value specified in a standard specification), the corresponding block may be considered as a bad block and not used any more.

For example, when the reference value for the number of the erasure operations of the memory blocks 110 and 120 is 10,000 in a case where the number of the erasure operations performed on the memory block 110 is 5,000, and the number of the erasure operations performed on the memory block 120 is 10,000, the control unit 130 determines that the memory block 120 is a bad block so that the memory block 120 is not used any more. Since the number of the erasure operations performed on the memory block 110 does not exceed the reference value, the memory block 110 is not determined to be as a bad block and thus memory block 110 is normally used.

In accordance with an exemplary embodiment of the present invention, the number of the erasure operations of each memory block is separately stored, and the memory block is determined to be a bad block when the number of the erasure operations exceeds the reference number. Thus, the corresponding memory block is not used to store data. As such, the memory blocks within the nonvolatile memory device may be efficiently used by taking into consideration different degraded states of memory blocks.

Figure 2:
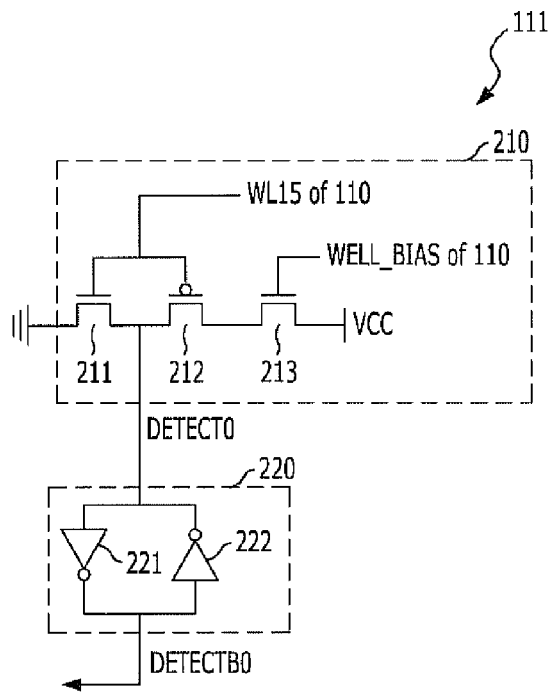
FIG. 2 is a configuration diagram of an erasure detection unit of FIG. 1 in accordance with an embodiment of the present invention.

FIG. 2 is a configuration diagram of the erasure detection unit 111 of FIG. 1 in accordance with an embodiment of the present invention.

The erasure detection unit 111 detects the erasure operation performed on the memory block 110. In order to perform the erasure operation on the memory block 110, an erasure bias (for example, 18 V or higher) are applied to well regions (also called bulk regions or back bias) of the memory cells of the memory block with an erasure voltage (for example, 0 V) being applied to word lines WL0 to WLN of the memory block 110. Therefore, the erasure detection unit 111 detects the application of the erasure voltage (0 V) to the word lines WL0 to WLN of the memory block 110 to which the erasure detection unit 111 belongs and the application of the erasure bias (18 V) to the well regions of the memory cells, and activates a detection signal DETECT0 notifying that the application of the erasure voltage and the erasure bias is detected.

The erasure detection unit 111 includes a detector 210 and a latch 220. The detector 210 activates the detection signal DETECT0 when the erasure voltage is applied to the word line WL15 of the memory block 110 and the erasure bias WELL_BIAS is applied to the well region of the memory block 110. The latch 220 stores the detection signal DETECT0 and transfers the stored detection signal DETECT0 to the control unit 130. Although in FIG. 2, the voltage of the word line WL15 among the word lines WL0 to WLN of the memory block 110 is shown as being applied to the detector 210, the detector 210 may be used for detecting any one of voltages of the word lines WL0 to WLN of the memory block 110.

The detector 210 includes NMOS transistors 211 and 213 and a PMOS transistor 212. The NMOS transistor 211 is designed to be turned on when a voltage of 1 V or higher is applied to its gate, and the NMOS transistor 213 is designed to be turned on when a voltage of 17 V or higher is applied to its gate. Also, the PMOS transistor 212 is designed to be turned on when a voltage of 0.3 V or lower is applied to its gate. In the erasure operation, a voltage of 0 V is applied to the word line WL15 of the memory block 110, and a voltage of 18 V or higher is applied as the erasure bias WELL_BIAS. Therefore, in the erasure operation, the PMOS transistor 212 and the NMOS transistor 213 are turned on and the detection signal DETECT0 becomes a high level. According to an example, in all operations except in the erasure operation, the PMOS transistor 212 and the NMOS transistor 213 are not turned on at the same time. Only the NMOS transistor 211 may be turned on in some operations. More specifically, the detector 210 activates the detection signal DETECT0 to a high level in, for example, the erasure operation only, and deactivates the detection signal DETECT0 to a low level in other operations.

The latch 220 includes two inverters 221 and 222 and stores the level of the detection signal DETECT0. Consequently, the number of activation of the detection signal DETECT0 stored in the latch 220 coincides with the number of the erasure operations performed on the memory block 110.

The control unit 130 counts the number of change in a logic level of an inverted detection signal DETECTB0 stored in the latch 220 and thus determines the number of the erasure operations performed on the memory block 110, and stores the result of the determination.

Although it is illustrated in FIG. 2 that the erasure detection unit 111 is designed using the three transistors 211, 212 and 213 and the latch 220, it would be apparent to a skilled artisan that the circuit for detecting the erasure operation performed on the memory block 110 can be designed in other ways as well.

The erasure detection unit 121 for detecting the erasure operation performed on the memory block 120 may be designed in the same manner as the erasure detection unit 111 described above with reference to FIG. 2.

Figure 3:
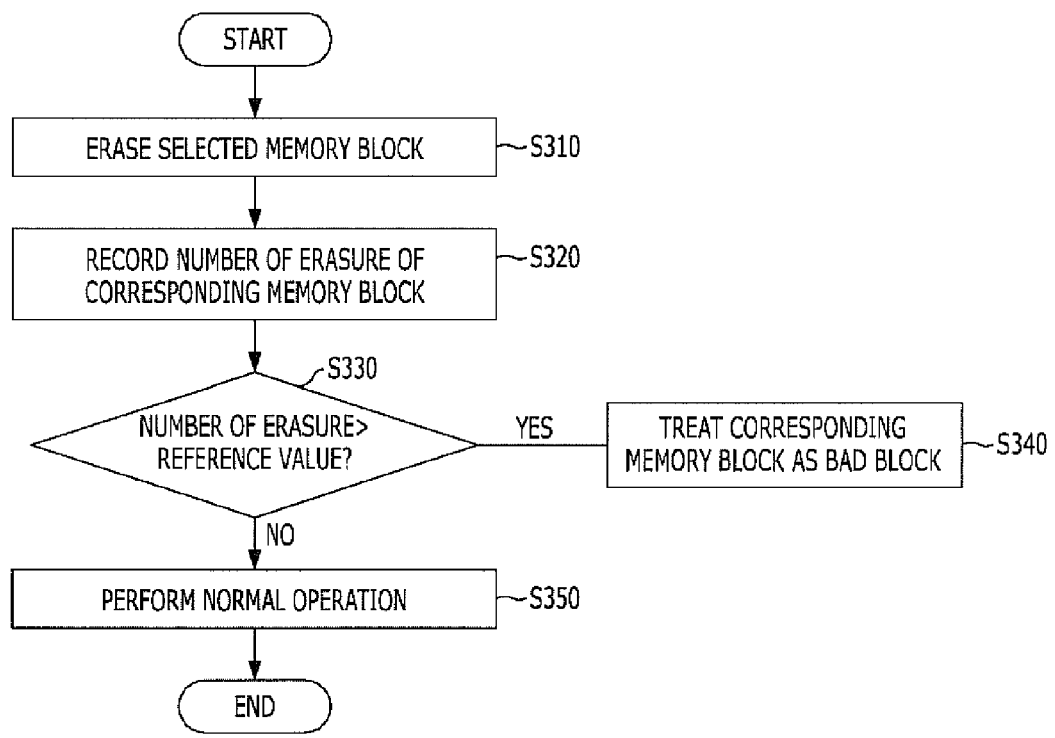
FIG. 3 is a flowchart illustrating a method for operating a nonvolatile memory device in accordance with an embodiment of the present invention.

FIG. 3 is a flowchart illustrating a method for operating a nonvolatile memory device in accordance with an embodiment of the present invention.

Referring to FIG. 3, the method for operating the nonvolatile memory device includes: performing an erasure operation on a memory block selected among a plurality of memory block (S310); recording the number of erasure of the memory block (S320); and treating a memory block as a bad block when the recorded number of erasure of the corresponding memory block is greater than a reference value among the plurality of memory blocks (S330, S340 and S350).

At the step S310, the erasure operation is performed on the memory block selected among the plurality of memory blocks. At the step S320, the number of erasure of the memory block on which the erasure operation is performed at the step S310 is recorded. As described above with reference to FIGS. 1 and 2, the step S320 may be performed by the operations of the control unit 130 and the erasure detection units 111 and 121 provided at the respective memory blocks 110 and 120. The steps S310 and S320 may be repetitively performed during operations of the nonvolatile memory device.

At the step S330, it is determined whether the number of erasure of the memory block exceeds the reference value. At the step S340, when it is determined at the step S330 that the number of erasure of the corresponding memory block exceeds the reference value, the corresponding memory block is treated as a bad block and is not used for storing data any more. At the step S350, when it is determined at the step S330 that the number of erasure of the corresponding memory block does not exceed the reference value, the corresponding memory block is normally used.

The step S330 may be performed whenever an erasure command or a program command is inputted, or may be periodically performed at a constant period (for example, at a period other than at every input period of an erasure or a program command).

In accordance with the embodiment of the present invention, the number of the erasure operations is checked at each memory block and, when the number of the erasure operations exceeds the reference value, the corresponding memory block is determined to be a bad block, thereby improving the reliability of the nonvolatile memory device.

Furthermore, a memory block within a chip which has been used too many times is determined to be a bad block, and other less-used memory blocks are normally used, thereby improving the use efficiency of the nonvolatile memory device.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device comprising:
a plurality of memory blocks;
a plurality of erasure detection units provided at the plurality of memory blocks, respectively, and configured to each detect an erasure operation of the respective memory block; and
a control unit configured to determine that a memory block of the plurality of memory blocks is a bad memory block when the number of erasure operations performed on the memory block as detected by the respective erasure detection unit is greater than a reference value.

2. The nonvolatile memory device of claim 1, wherein the erasure detection units are each configured to detect the application of an erasure voltage to a word line for the respective memory block.

3. The nonvolatile memory device of claim 1, wherein the erasure detection units each comprise:
a detector configured to activate a detection signal when an erasure voltage is applied to a word line of the respective memory block and an erasure bias is applied to a well region of the respective memory block; and
a latch configured to store the detection signal and transfer the stored detection signal to the control unit.

4. The nonvolatile memory device of claim 1, wherein the memory block is a unit of the erasure operation of the nonvolatile memory device.

5. The nonvolatile memory device of claim 2, further comprising:
a plurality of row circuits configured to apply voltages suitable for erasure/read/program operations to the word lines; and
a plurality of column circuits configured to each control a bit line according to the erasure/read/program operations of a respective one of the plurality of memory blocks.

6. The nonvolatile memory device of claim 5, wherein the control unit receives a command and an address inputted from outside of the memory device and controls the plurality of row circuits and the plurality of column circuits so that the plurality of memory blocks are erased/read/programmed.

7. The nonvolatile memory device of claim 3, wherein the detector includes:
a first NMOS transistor configured to be turned on when a voltage of 1 V or higher is applied to its gate;
a second NMOS transistor configured to be turned on when a voltage of 17 V or higher is applied to its gate; and
a first PMOS transistor configured to be turned on when a voltage of 0.3 V or lower is applied to its gate.

8. The nonvolatile memory device of claim 7, wherein the control unit detects the number of the erasure operations performed on the memory block by counting the number of logic level changes of the detection signal.

9. A method for operating a nonvolatile memory device, the method comprising:
performing an erasure operation on a memory block selected among a plurality of memory blocks;
determining the number of erasure operations performed on the memory block; and
determining that the memory block is a bad memory block when the number of erasure operations performed on the memory block is greater than a reference value.

10. The method of claim 9, wherein the determining the number of erasure operations comprises:
activating a detection signal when an erasure voltage is applied to a word line of the memory block and an erasure bias is applied to a well region of the memory block;
storing the detection signal; and
counting number of changes in a logic value of the stored detection signal.

11. The method of claim 9, wherein the performing of the erasure operation and the determining of the number of erasure operations are repetitively performed.

12. The method of claim 9, wherein the determining of the number of erasure operations includes activating with an erasure detection unit a detection signal when an erasure voltage is applied to a word line of the memory block, and wherein the erasure detection unit includes a first PMOS transistor, second NMOS transistor, and third NMOS transistor that are connected in series.

13. The method of claim 12, wherein, when the first PMOS transistor and the second NMOS transistor are turned on, the detection signal becomes a logic high level in the erasure operation.

14. The method of claim 12, wherein, when the first PMOS transistor and the second NMOS transistor are not turned on at the same time and the first NMOS transistor is turned on, the detection signal becomes a logic low level.

* * * * *